(12) United States Patent
Mezouari et al.

(10) Patent No.: US 12,727,297 B2
(45) Date of Patent: Sep. 1, 2026

(54) ARRAY OF LIGHT EMITTING DEVICES WITH REDUCED OPTICAL CROSSTALK

(71) Applicant: PLESSEY SEMICONDUCTORS LTD, Plymouth (GB)

(72) Inventors: Samir Mezouari, Plymouth (GB); James Pilkington, Plymouth (GB); Colin Evestaff, Plymouth (GB); Keith Strickland, Plymouth (GB)

(73) Assignee: Plessey Semiconductors Ltd, Plymouth (GB)

( * ) Notice: Subject to any disclaimer, the term of this patent is extended or adjusted under 35 U.S.C. 154(b) by 676 days.

(21) Appl. No.: 17/920,998

(22) PCT Filed: May 12, 2021

(86) PCT No.: PCT/GB2021/051133
§ 371 (c)(1),
(2) Date: Oct. 24, 2022

(87) PCT Pub. No.: WO2021/234345
PCT Pub. Date: Nov. 25, 2021

(65) Prior Publication Data

US 2023/0170446 A1 Jun. 1, 2023

(30) Foreign Application Priority Data

May 19, 2020 (GB) ..................................... 2007385

(51) Int. Cl.
*H10H 20/851* (2025.01)
*H10H 20/01* (2025.01)
(Continued)

(52) U.S. Cl.
CPC ........ *H10H 20/8512* (2025.01); *H10H 20/01* (2025.01); *H10H 20/8514* (2025.01);
(Continued)

(58) Field of Classification Search
CPC ................ H01L 25/0753; H10H 20/01; H10H 20/0361; H10H 20/84; H10H 20/851; H10H 20/8512; H10H 20/8514; H10H 29/142
See application file for complete search history.

(56) References Cited

U.S. PATENT DOCUMENTS

2012/0119237 A1 5/2012 Leatherdale et al.
2017/0117444 A1* 4/2017 Stoll ...................... H10K 50/86
(Continued)

FOREIGN PATENT DOCUMENTS

CN 109004078 A 12/2018
CN 110211986 A 9/2019
(Continued)

OTHER PUBLICATIONS

Kanibolotsky et al. ("Design of Linear and Star-Shaped Macromolecular Organic Semiconductors for Photonic Applications"; Accounts of Chemical Research; vol. 52/Issue 6 (Year: 2019).*
(Continued)

*Primary Examiner* — Matthew C Landau
*Assistant Examiner* — Dmitriy Yemelyanov
(74) *Attorney, Agent, or Firm* — Cognition IP, P.C.; Edward Steakley

(57) ABSTRACT

An array comprising a plurality of light emitting pixels, wherein at least two of the plurality of light emitting pixels are separated by organic semiconductors dispersed in a medium, wherein the organic semiconductors are configured to absorb light of a predefined wavelength, thereby to reduce optical crosstalk across the medium between the at least two of the plurality of light emitting pixels.

16 Claims, 2 Drawing Sheets

(51) Int. Cl.
*H10H 29/14* (2025.01)
*H10W 90/00* (2026.01)

(52) U.S. Cl.
CPC .......... *H10H 29/142* (2025.01); *H10W 90/00* (2026.01); *H10H 20/0361* (2025.01)

(56) References Cited

U.S. PATENT DOCUMENTS

| | | | | |
|---|---|---|---|---|
| 2018/0259852 | A1 | 9/2018 | Tanigaki et al. | |
| 2019/0267357 | A1 * | 8/2019 | Iguchi | H01L 25/0753 |
| 2019/0393286 | A1 * | 12/2019 | Ding | H10K 59/131 |
| 2020/0185351 | A1 * | 6/2020 | Mityashin | H01L 25/0756 |
| 2021/0151637 | A1 * | 5/2021 | Martin | H10H 20/812 |

FOREIGN PATENT DOCUMENTS

| | | | | |
|---|---|---|---|---|
| JP | 2013501357 | A | 1/2013 | |
| JP | 2019153783 | A | 9/2019 | |
| TW | 201815936 | A | 5/2018 | |
| WO | WO-2016039063 | A1 * | 3/2016 | C08G 61/12 |
| WO | 2017057281 | A1 | 5/2018 | |

OTHER PUBLICATIONS

International Search Report and Written Opinion in PCT International Application No. PCT/GB2021/051133 mailed Aug. 13, 2021.
Taylor-Shaw, Elaine et al., "Cool to Warm White Light Emission from Hybrid Inorganic/Organic Light-Emitting Diodes", Journal of Materials Chemistry, vol. 4, No. 48; Jan. 1, 2016, pp. 11499-11507.
International Preliminary Report on Patentability in PCT International Application No. PCT/GB2021/051133 mailed Nov. 17, 2022.

* cited by examiner

ARRAY OF LIGHT EMITTING DEVICES WITH REDUCED OPTICAL CROSSTALK

CROSS-REFERENCE TO RELATED APPLICATIONS

This application is a 35 U.S.C. § 371 national stage application of PCT International Application No. PCT/GB2021/051133, filed May 12, 2021, which claims the benefit of Great Britain Application No. 2007385.4, filed May 19, 2020, which are hereby incorporated by reference in their entirety.

FIELD OF THE INVENTION

The invention relates to arrays of light emitting pixels and methods of forming arrays of light emitting pixels. In particular, but not exclusively, the invention relates to arrays of light emitting diode devices with reduced optical crosstalk and methods of forming arrays of light emitting diode devices with reduced optical crosstalk.

BACKGROUND OF THE INVENTION

Light emitting devices are known to have a wide range of practical applications, including, for example, in display technologies. In particular, it is known that light emitting diode (LED) devices have the potential to provide efficient sources of light for a wide range of pixel-array based display technologies. Increases in LED light generation efficiency and extraction, along with the production of smaller LEDs (with smaller light emitting surface areas) and the integration of different wavelength LED emitters into arrays, has resulted in the provision of high quality colour arrays with multiple applications. However, as the pixel pitch in such arrays is reduced to very small pitches (e.g., less than 5 μm) in order to provide higher resolution arrays of micro LED based pixels, a number of difficulties arise, in particular with respect to the fabrication of such arrays and the colour gamut.

One particular challenge in reducing the pixel pitch in arrays of micro LED devices is the separation of individual light emitting pixels such that light emitted by one pixel does not interfere with light emitted by another pixel in the array. Where there is such crosstalk in light emission between pixels in an array, the resultant array has a reduction in the overall quality (including colour and contrast) of light that is emitted.

Known techniques, for reducing optical crosstalk between pixels, for example in liquid crystal display (LCD) applications, do so by using 'black absorbers' to create a matrix surrounding individual pixels in arrays pixels. However, black absorbers, such as 'black resist' (for example the pigmented photoresist for a black matrix described by Kudo et al, *Journal of Photopolymer Science and Technology*, Volume 9, Number 1 (1996), 121-130) are typically unable to be resolved less than 10 μm, making them unsuitable for very high resolution micro LED arrays, where the pixel pitch is less than 5 μm.

Accordingly, since the size of features in high resolution arrays, such as micro LED arrays, is very small, significant challenges are seen in the processing of arrays to provide high quality micro LED devices with relatively low optical crosstalk.

SUMMARY OF THE INVENTION

In order to mitigate for at least some of the above-described problems, there is provided an array of light emitting pixels in accordance with the appended claims. Further, there is provided a method for forming an array of light emitting pixels in accordance with the appended claims.

There is provided an array comprising a plurality of light emitting pixels, wherein at least two of the plurality of light emitting pixels are separated by organic semiconductors dispersed in a medium, wherein the organic semiconductors are configured to absorb light of a predefined wavelength, thereby to reduce optical crosstalk across the medium between the at least two of the plurality of light emitting pixels. Further, there is provided a method of forming an array comprising a plurality of light emitting pixels, wherein at least two of the plurality of light emitting pixels are separated by organic semiconductors dispersed in a medium, wherein the organic semiconductors are configured to absorb light of a predefined wavelength, thereby to reduce optical crosstalk across the medium between the at least two of the plurality of light emitting pixels.

Advantageously, high resolution arrays can be provided with improved colour contrast and gamut.

Preferably, at least two of the plurality of light emitting pixels are separated by a distance of less than or equal to 2 μm and preferably less than or equal to 1 μm.

Advantageously, very high resolution arrays of light emitting pixels are provided, enabling improved displays suitable for applications that benefit from particularly high resolution arrays, such as augmented reality applications, where the display is typically formed in close proximity to a user.

Preferably, at least two of the plurality of light emitting pixels each comprise a micro light emitting diode (LED) device (e.g., LED devices formed on a micro scale, as understood by the skilled person, where the light emitting surface of the micro LED is of the order of less than or equal to 100 $\mu m^2$ and where the pixel pitch of a micro LED array is less than or equal to 10 μm).

Advantageously, micro LED devices are efficient sources of light that form efficient arrays of light emitting pixels with reduced energy consumption and increased light output compared with other light sources.

Preferably, at least one of the plurality of light emitting pixels comprise a light conversion layer arranged to receive input light with a primary peak wavelength and convert the input light to output light with a different primary peak wavelength.

Advantageously, light conversion layers enable the use of highly efficient LEDs, such as blue-emitting nitride based epitaxially grown crystalline semiconductor devices to be used as a pump source for conversion layers, thereby enabling the most efficient LEDs to be used whilst reducing the need for different types of LED to be implemented in an array.

Preferably, the organic semiconductors are conjugated organic semiconductors comprising a plurality of conjugated structures, preferably wherein the organic semiconductors are organic semiconductors, more preferably wherein the plurality of conjugated structures comprise a core and an arm.

Advantageously, such organic semiconductors are tunable to provide functionality that enables them to be implemented into standard semiconductor fabrication techniques whilst enabling efficient processing of structures with smaller features than in the known art.

Preferably, at least two of the plurality of conjugated structures have a different functional property.

Advantageously, multi-functionality means that organic semiconductors are implementable in colour conversion layers to provide high quality, fast response down conversion of the wavelength of input light. Beneficially, multi-functionality means that organic semiconductors are tunable to absorb multiple wavelengths of light, thereby to provide an efficient absorbing layer that facilitates shorter pixel pitch in arrays of light emitting pixels.

Preferably, the array comprises further organic semiconductors configured to absorb light of a further predefined wavelength different to the predefined wavelength.

Advantageously, specific wavelengths of light are absorbed by different organic semiconductors, thereby to extend the range of undesirable wavelengths that would otherwise contribute to optical crosstalk between light emitting pixels.

Preferably, the organic semiconductors are configured to absorb light of a predefined range of wavelengths comprising the predefined wavelength.

Advantageously, ranges of light, such as visible light, are absorbed, thereby aiding a reduction in optical crosstalk between light emitting pixels and providing improved colour emission from the array.

Preferably, the medium is at least one of a resin and a polymer medium.

Advantageously, resins and polymers provide media in which organic semiconductors are dispersed, whilst enabling efficient processing that uses known semiconductor fabrication tools in an economical (time and cost) manner Preferably, the array is a high resolution micro LED array with a pixel pitch less than 10 μm, preferably less than 4 μm.

Advantageously, the use of organic semiconductors in high resolution arrays of light emitting pixels enables reduced optical crosstalk on a scale that has particularly advantageous applications that benefit from such high resolution.

Preferably, the plurality of light emitting pixels each have a light emitting surface that is less than or equal to 100 $\mu m^2$, preferably less than 16 $\mu m^2$.

Advantageously, not only are closer pixels achievable by reducing the pixel pitch, but smaller light emitting surfaces are producible, thereby enhancing the overall emission from a high resolution array of light emitting pixels whilst maintaining colour integrity.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the Figures, in which.

As described above, down-scaling arrays of light emitting diode (LED) devices to produce high resolution micro LED arrays with associated micro-scale light emitting pixels results in difficulties associated with optical crosstalk between light emitting pixels in the arrays and hence a diminution in the purity of light associated with light emitting pixels, and in the contrast between light emitting pixels compared with arrays formed from larger features (e.g., with longer pixel pitch and/or conventionally larger LED devices). A structure and method described with reference to FIGS. 1A to 3 provides for an array of light emitting pixels with reduced optical crosstalk, enabling the provision of high resolution micro LED arrays with improved colour gamuts and contrast.

Figure 1A:
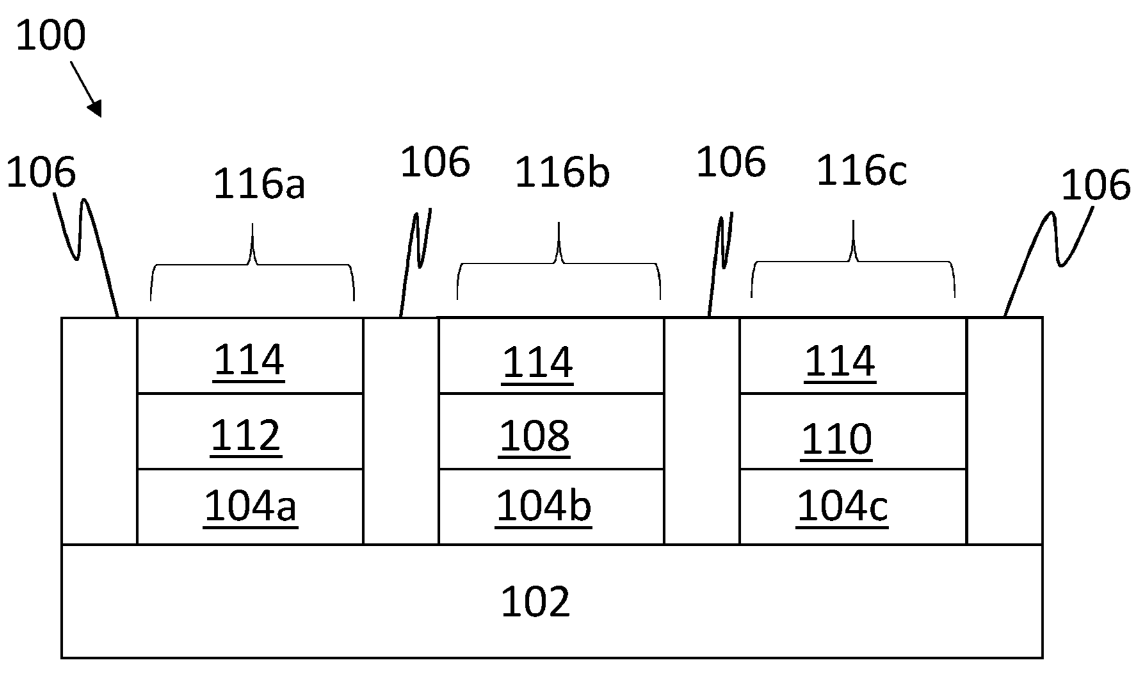
FIG. 1A shows a cross sectional view of three light emitting pixels.

FIG. 1A shows a cross-sectional view 100 of three light emitting pixels 116*a*, 116*b*, 116*c*. There is shown a complementary metal oxide semiconductor (CMOS) backplane 102, upon which there is provided an array of micro LEDs 104*a*, 104*b*, 104*c*. The CMOS backplane 102 is configured to work with the micro LEDs 104*a*, 104*b*, 104*c* in order selectively to control light emission from the array of micro LEDs. There are three micro LEDs 104*a*, 104*b*, 104*c* shown in FIG. 1A. The micro LEDs 104*a*, 104*b*, 104*c* are nitride based epitaxial crystalline semiconductor LEDs configured to emit light with a primary peak wavelength that is blue (approximately 450 nm). In order to provide a red-green-blue (RGB) multi-colour display, the blue light emitted by the micro LEDs 104*a*, 104*b*, 104*c* is converted using colour conversion layers that are formed on the micro LEDs 104*a*, 104*b*, 104*c*.

The view 100 of FIG. 1A shows a first blue micro LED 104*a* upon which there is deposited a clear resin 112. Upon the clear resin 112 there is deposited a protective, passivation, layer 114. The protective layer 114 is transparent to visible light and forms at least part of a light emitting surface associated with the micro LED 104*a*. The micro LED 104*a*, the clear resin 112 and the protective layer 114 form a first light emitting pixel 116*a*. Whilst a clear resin 112 is used to processing of the protective layer 114 such that the protective layer 114 is uniformly distributed across different light emitting pixels in an array of light emitting pixels, in further examples, alternative or additional layers are used instead of clear resin 112. In further examples, the clear resin 112 is omitted where colour conversion of light from an associated light emitting diode device is not used.

There is also shown a second blue micro LED 104*b*, upon which there is formed a colour conversion layer 108 that is configured to convert light from the micro LED 104*b* such that input light with a primary peak wavelength that is blue is converted to a primary wavelength that is red. Upon the colour conversion layer 108 there is a passivation, protective layer 114. The protective layer 114 is transparent to visible light and forms at least part of a light emitting surface associated with the micro LED 104*b*. The micro LED 104*b*, the colour conversion layer 108 and the protective layer 114 form a second light emitting pixel 116*b*.

There is also shown a third micro LED 104*c* that is configured to emit light with a primary peak wavelength that is blue (approximately 450 nm). Upon the third blue micro LED 104*c*, there is provided a colour conversion layer 110 that is different to the colour conversion layer 108 associated with the second micro LED 104*b*. The second colour conversion layer 110 is configured to receive input light from the third micro LED 104*c* and convert it from light that has a primary peak wavelength that is blue light to light that has a primary peak wavelength that is green. Upon the colour conversion layer 110 there is a passivation layer that functions as a protective layer 114. The protective layer 114 is transparent to visible light and forms at least part of a light emitting surface associated with the micro LED 104*b*. The micro LED 104*a*, the colour conversion layer 110 and the protective layer 114 form a third light emitting pixel 116*c*.

The colour conversion layers 108, 110 described with respect to FIG. 1A comprise a medium in which organic semiconductors are dispersed. It is known that down converting organic semiconductors can be tuned in order to achieve targeted physical properties. In particular, advantageously, organic semiconductors can achieve specific values for the ionisation potential or electronic affinity, absorption and emission characteristics, charged transport properties, phase behaviour, solubility, and processability. Typically, organic semiconductors are conjugated organic semiconductors comprising a plurality of conjugated structures. In an example, such conjugated structures include a core and arm. The functionality of these constituent parts of the organic semiconductor are tuned in order to provide particular characteristics.

Macromolecules are discussed in *Acc. Chem. Res* 2019, 52, 1665 to 1674 and *J. Mater. Chem. C,* 2016, 4, 11499, for example. Macromolecules that are tunable include conjugated organic semiconductor comprising a plurality of conjugated structures. These are typically organic semiconductors. Such structures are formable to comprise a core and an arm. The plurality of conjugated structures can be formed to have a different functional properties, for example, different absorption and/or emission characteristics.

With reference to the colour conversion layers 108, 110, of FIG. 1A, the organic semiconductors in these layers are configured to absorb blue light received from their respective LED 104*b*, 104*c*. The organic semiconductors are then further configured to emit light at a different, converted wavelength. For example, one light emitting pixel 116*b* is configured to emit red light from the colour conversion layer 108 upon absorption of blue light from the micro LED 104*b*. Another pixel 116*c* is configured to emit green light from the colour conversion layer 110 upon absorption of blue light from the micro LED 104*c*. Advantageously, the use of organic semiconductors enables thin colour conversion layers to be implemented that facilitate smaller LEDs. Whilst the colour conversion layers 108, 110 described with respect to FIG. 1A are arranged to absorb and emit light of particular wavelengths, the skilled person understands that in further examples, alternatively or additionally, different combination and configurations of light wavelength conversion are used in order to provide different arrays of light emitting pixels.

The LEDs 104*a*, 104*b*, 104*c* are epitaxially grown as a monolithic array of blue micro LEDs with primary light emitting surfaces of less than or equal to 10 $\mu m^2$. In further examples, alternatively or additionally, the LEDs 104*a*, 104*b*, 104*c* are associated with the CMOS backplane 102 using pick and place methods, for example. The blue micro LEDs 104*a*, 104*b*, 104*c* are nitride-based epitaxially grown compound crystalline semiconductor LEDs. In further examples, other LEDs are used, such as other group III-V, or group II-VI based materials. In further examples, alternative or additional LEDs of different sizes and shapes are implemented. Advantageously, the LEDs 104*a*, 104*b*, 104*c* are grown monolithically, thereby to provide high quality material with excellent uniformity and efficiency, without a requirement to transfer individual LED devices. Beneficially, the monolithic LED array is coupled to a backplane 102 in order to enable control of individual LEDs 104*a*, 104*b*, 104*c* in the monolithic array. The LEDs 104*a*, 104*b*, 104*c* are grown as part of a monolithic array of LEDs using metal organic chemical vapour deposition (MOCVD). In further examples, alternative and/or additional techniques are used to form the LEDs 104*a*, 104*b*, 104*c* as part of a monolithic array, such as molecular beam epitaxy (MBE) and other suitable deposition/growth techniques. In further examples, other additional and/or alternative semiconductor fabrication and processing techniques are used to provide the monolithic array of LEDs 104*a*, 104*b*, 104*c*.

In-between each of the light emitting pixels 116*a*, 116*b*, 116*c*, formed by the combination of a micro LED with or without colour conversion layers, there is provided an infill 106. The infill 106 is formed by dispersing organic semiconductors in a medium and patterning or depositing the medium between light emitting pixels to form a matrix of infill 106. As described above with reference to the colour conversion layers 108, 110, organic semiconductors are tunable to provide certain properties. The organic semiconductors dispersed to form the infill 106 are configured to absorb light of a predefined wavelength. Whilst the infill 106 is described with respect to a medium in which organic semiconductors configured to absorb light of a predefined wavelength, in further examples, the medium comprises further organic semiconductors configured to absorb light at a further predefined wavelength, different to the predefined wavelength.

In the example of FIG. 1A, the infill 106 is configured to absorb visible light for a predefined range of wavelengths. Advantageously, the infill 106 is formed in between light emitting pixels 116*a*, 116*b*, 116*c* such that light emitted by the micro LEDs 104*a*, 104*b*, 104*c* associated with each of the light emitting pixels 116*a*, 116*b*, 116*c* is absorbed around the periphery of each of the light emitting pixels 116*a*, 116*b*, 116*c* surrounded by the infill 106. Advantageously, the infill 106 forms a matrix around the light emitting pixels 116*a*, 116*b*, 116*c* that confines light emission from the light emitting pixels 116*a*, 116*b*, 116*c* to a light emitting surface associated with each of the light emitting pixels. Beneficially, the use of a passivation, protective layer 114 buries the light emitting structures (formed from the micro LEDs and the colour conversion layers) such that the light emitted by each light emitting pixel is confined laterally, thereby aiding the contrast between light emitting pixels and aiding the colour gamut of the resultant array of light emitting pixels.

Figure 1B:
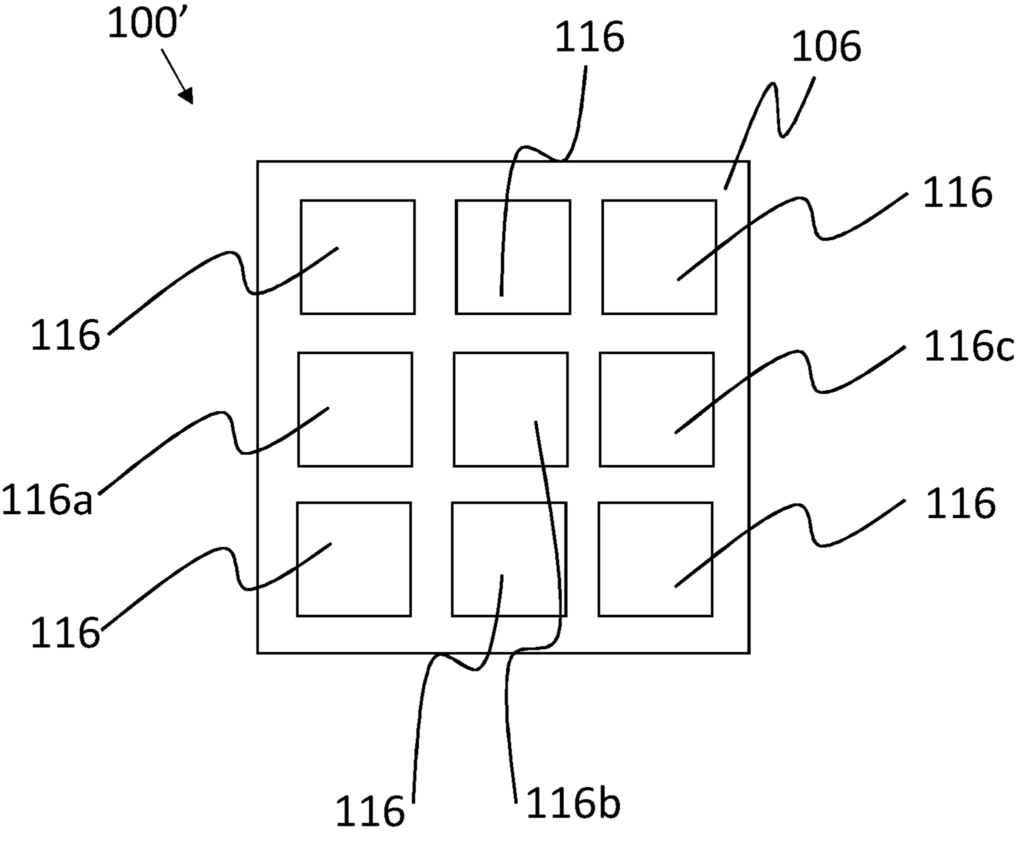
FIG. 1B shows a plan view of an array of light emitting pixels.

FIG. 1B shows a plan view 100' of an array of pixels in a micro LED array. There is shown a matrix of infill 106 surrounding pixels 116. The pixels 116 correspond to any of the combinations of micro LED 104*a*, 104*b*, 104*c* with colour conversion layers 108, 110 or clear resin 112 described with respect to FIG. 1A and in FIG. 1B there is shown blue, green and red light emitting pixels 116*a*, 116*b*, 116*c* described with respect to FIG. 1A amongst other light emitting pixels 116. Whilst the light emitting pixels 116*a*, 116*b*, 116*c* of FIG. 1A and FIG. 1B are shown in a particular arrangement, in further examples, arrays of light emitting pixels comprise any appropriate number of light emitting pixels in any suitable arrangement and with any suitable light emitting surface associated with each of the light emitting pixels. Whilst the infill 106 is shown to surround each individual pixel, in further examples the infill 106 alternatively or additionally separates at least two pixels in order to reduce optical crosstalk whilst surrounding combinations of pixels in accordance with the structure in which the infill 106 is utilised.

The light emitting pixels 116 have a light emitting surface corresponding to the plan view area of the pixels 116. Whilst the pixels are shown to be square in plan view, in further examples, alternatively or additionally the pixel plan view shapes are different. For example, the pixels 116 may assume a hexagonal shape light emitting surfaces. In further examples, the pixels 116 may be grouped In an example, advantageously, the array of micro LEDs 104*a*, 104*b*, 104*c* is processed in order to provide the clear resin 112, colour conversion layers 108, 110 and the further protective layer 114 using a minimum number of processing steps. For example, such processing involves depositing the protective layer 114 simultaneously on each light emitting pixel structure. Whilst the formation of the infill 106 is implemented once the array has been provided, in further examples the infill 106 is formed at any appropriate stage of the formation of the array of light emitting pixels.

Beneficially, the infill 106 is formed from a photo definable material. The photo definable material comprises a medium in which organic semiconductors, are dispersed. The organic semiconductors are configured to absorb light at a first predefined wavelength. In further examples, the organic semiconductor is also configured to absorb light of a second predefined wavelength different to the first predefined wavelength. In further examples, additionally or alternatively, the medium in which the organic semiconductors are dispersed is definable using different methods, for example using thermally curing in order to harden the medium once it has been formed in around the light emitting pixels in an array of light emitting pixels.

Figures 2, 3:
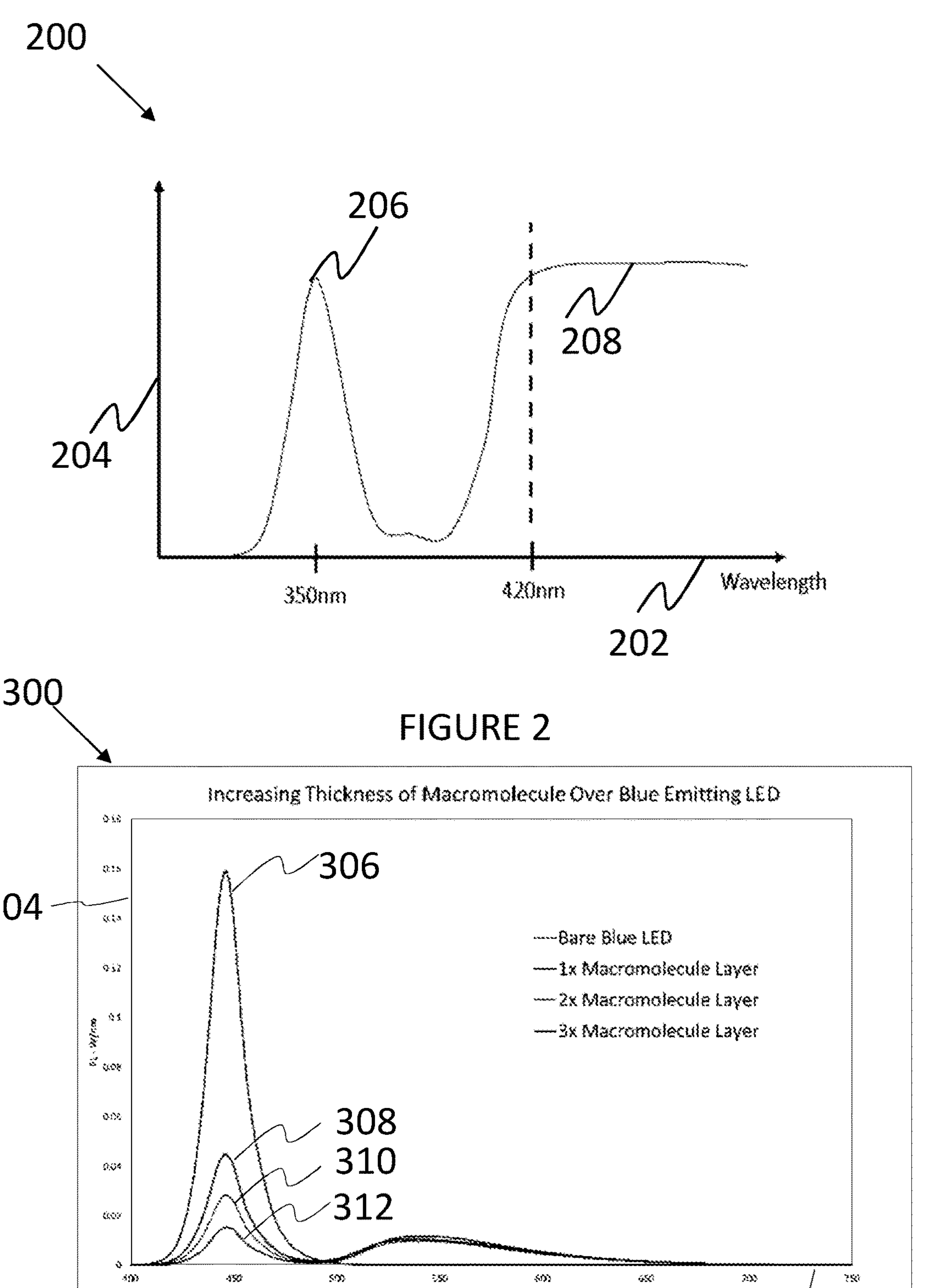
FIG. 2 shows an absorption spectrum of a material comprising organic semiconductors.
FIG. 3 shows light emission spectra through different thickness of material comprising organic semiconductors.

An absorption spectrum 200 of a photo definable material comprising a organic semiconductor, such as that used as infill 106 in respect of FIGS. 1A and 1B, is shown at FIG. 2. At FIG. 2 there is shown an absorption spectrum 200 of a photo definable material comprising organic semiconductors dispersed in the photodefinable material. The level of absorption is shown on the y-axis 204 and plotted as a function of wavelength, which is shown on the x-axis 202.

There is shown a first absorption peak 206 at 350 nm. This absorption peak 206 corresponds to absorption of ultraviolet light by the photodefinable material medium in which the organic semiconductors are dispersed. Absorption of light at 350 nm enables the medium in which the organic semiconductors are dispersed to be cured as part of photolithographic patterning techniques. There is also shown a second absorption peak 208 that extends as a range of predefined wavelengths greater than 420 nm. The organic semiconductors are tuned such that second absorption peak 208 absorbs visible light generated by the light emitting pixels 116.

Advantageously, the combination of organic semiconductors with the absorption properties shown at FIG. 2 and the medium in which the organic semiconductors are dispersed, provides an elegant and efficient material to provide the infill 106 described with respect to FIGS. 1A and 1B.

In particular, the medium in which the organic semiconductors are dispersed is arranged to cure in response to absorption of ultraviolet light, for example light at 350 nm. Therefore, ultra violet (UV) light is used in order to harden the material in which the organic semiconductors are dispersed. However, the medium itself is not responsive to light of other wavelengths.

Advantageously, this facilitates fabrication steps used with mainstream semiconductor equipment. For example, where standard lithographical tools are used in order to cure resins or polymers, the absorption peak 206 at 350 nm shown at FIG. 2 means that UV exposures in the photographical tools are fully absorbed and hence control of the processes is improved.

Further absorption at visible wavelengths as described with respect to the second absorption peak 208 of FIG. 2, means that the photo definable material comprising the medium and organic semiconductors is suitable for defining separate pixels in a micro LED array of pixels. Advantageously, using organic semiconductors which can absorb in the visible spectrum means that the requirements for processing the medium and the functionality of the infill as an absorption layer are de-convolved.

The use of such organic semiconductors to absorb visible light is demonstrated at FIG. 3. FIG. 3 shows light emission spectrum 300 through different thicknesses of photo-definable material comprising organic semiconductors configured to absorb blue light. The intensity of light emitted from a blue LED is measured on the vertical axis 304 and wavelength is measured on the horizontal axis 302. As can be seen at FIG. 34, the intensity peak 306 for a bare blue LED is considerably higher than that of a bare blue LED with one layer of organic semiconductor 308, which is in turn greater than that of two organic semiconductor layers 310 which is in turn greater than three organic semiconductor layers 312. In the example of FIG. 3, each of the organic semiconductor layers is approximately 200 nm thick. Therefore, it can be seen that the high absorption of visible light is achieved with relatively thin layers of material. In further examples, different thicknesses of organic semiconductor layers are used to absorb light emission from light emitting pixels, thereby to reduce optical crosstalk, e.g., by varying the functionality and/or density of the organic semiconductors dispersed in the medium and/or using multiple, different, organic semiconductors in dispersed in the medium to reduce crosstalk.

Accordingly, crosstalk between separate light emitting pixels is achievable using even very thin layers of photodefinable material comprising the medium and organic semiconductor. Beneficially, such material is processable on a small scale.

Whilst the micro LED 104*a*, 104*b*, 104*c* are blue emitting micro LEDs. In further examples, alternatively, or additionally, different micro LEDs are used with different primary peak wavelengths of emission.

Advantageously, the use of organic semiconductors dispersed in a medium in both the infill 106 and the colour conversion layers 108, 110 enables closely packed pixels, where pixels are separated by a distance of less than or equal to 2 μm and preferably less than or equal to 1 μm, to be provided in a high resolution micro LED array with reduced optical crosstalk between pixels.

What is claimed is:

1. A high resolution micro light emitting diode array comprising a plurality of light emitting pixels, wherein at least two of the plurality of light emitting pixels each comprise a light emitting diode device and are separated by a distance of less than or equal to 1 μm by conjugated organic semiconductors dispersed in a medium, wherein the conjugated organic semiconductors absorb light at a predefined wavelength corresponding to a primary peak wavelength of light emitted by at least one of the light emitting pixels.

2. The array according to claim 1, wherein at least one of the plurality of light emitting pixels comprise a colour conversion layer arranged to receive input light with a primary peak wavelength and convert the input light to output light with a different primary peak wavelength.

3. The array according to claim 2, wherein the colour conversion layer comprises organic semiconductors configured to convert the input light to output light.

4. The array according to claim 1, comprising further organic semiconductors configured to absorb light of a further predefined wavelength different to the predefined wavelength.

5. The array according to claim 1, wherein the organic semiconductors are configured to absorb light of a predefined range of wavelengths comprising the predefined wavelength.

6. The array according to claim 1, wherein the medium is at least one of a resin and a polymer medium.

7. The array according to claim 1, wherein the array is a high resolution micro LED array with a pixel pitch less than 10 μm.

8. The array according to claim 1, wherein the plurality of light emitting pixels each have a light emitting surface that is less than or equal to 100 $\mu m^2$.

9. A method of forming an high resolution micro light emitting diode array comprising a plurality of light emitting pixels, wherein at least two of the plurality of light emitting pixels each comprise a micro light emitting diode device and are separated by a distance of less than or equal to 1 μm by conjugated organic semiconductors dispersed in a medium, wherein the conjugated organic semiconductors absorb light at a predefined wavelength corresponding to the primary peak wavelength of light emitted by at least one of the plurality of micro light emitting diode devices.

10. The method according to claim 9, wherein at least one of the plurality of light emitting pixels comprise a colour conversion layer arranged to receive input light with a primary peak wavelength and convert the input light to output light with a different primary peak wavelength.

11. The method according to claim 10, wherein the colour conversion layer comprises organic semiconductors configured to convert the input light to output light.

12. The method according to claim 9, wherein the array comprises further organic semiconductors dispersed in the medium, wherein the further organic semiconductors are configured to absorb light of a further predefined wavelength different to the predefined wavelength.

13. The method according to claim 9, wherein the organic semiconductors are configured to absorb light of a predefined range of wavelengths comprising the predefined wavelength.

14. The method according to claim 9, wherein the medium is at least one of a resin and a polymer medium.

15. The method according to claim 9, wherein the array is a high resolution micro LED array with a pixel pitch less than 10 μm.

16. The method according to claim 9, wherein the plurality of light emitting pixels each have a light emitting surface that is less than or equal to 100 $\mu m^2$.

* * * * *